US009166545B2

(12) United States Patent
Low (10) Patent No.: US 9,166,545 B2
(45) Date of Patent: Oct. 20, 2015

(54) CIRCUIT FOR PROVIDING A FLAT GAIN RESPONSE OVER A SELECTED FREQUENCY RANGE AND METHOD OF USE (71) Applicant: MediaTek Singapore Pte. Ltd., Singapore (SG)

(72) Inventor: Eng-Chuan Low, Dover Crescent (SG)

(73) Assignee: MEDIATEK SINGAPORE PTD. LTD., Singapore (SG)

( * ) Notice: Subject to any disclaimer, the term of this patent is extended or adjusted under 35 U.S.C. 154(b) by 98 days.

(21) Appl. No.: 13/947,813

(22) Filed: Jul. 22, 2013

(65) Prior Publication Data

US 2014/0253249 A1    Sep. 11, 2014

Related U.S. Application Data (60) Provisional application No. 61/776,041, filed on Mar. 11, 2013.

(51) Int. Cl.
*H03G 5/02*      (2006.01)
*H03F 1/42*      (2006.01)
*H03G 3/20*      (2006.01)
*H03F 1/22*      (2006.01)
*H03F 3/193*     (2006.01)

(52) U.S. Cl.
CPC ............... *H03G 5/025* (2013.01); *H03F 1/223* (2013.01); *H03F 1/42* (2013.01); *H03F 3/193* (2013.01); *H03G 3/20* (2013.01)

(58) Field of Classification Search
CPC .................................. H03F 3/191; H03F 3/195
USPC ............. 330/302–307; 333/174, 179; 455/63, 455/323, 326
See application file for complete search history.

(56) References Cited

U.S. PATENT DOCUMENTS

| 6,812,789 | B2 | 11/2004 | Mackey et al. | |
| 7,030,692 | B2 | 4/2006 | Chiu | |
| 8,150,362 | B2 * | 4/2012 | Waight et al. | 455/339 |
| 8,340,616 | B2 * | 12/2012 | Shah et al. | 455/286 |
| 2007/0247237 | A1 * | 10/2007 | Mohammadi | 331/36 C |
| 2010/0007414 | A1 | 1/2010 | Searle et al. | |
| 2011/0212692 | A1 * | 9/2011 | Hahn et al. | 455/63.1 |
| 2011/0227666 | A1 * | 9/2011 | Manssen et al. | 333/32 |

OTHER PUBLICATIONS

Aguilera, J. and Berenguer, R., "Design and Test of Integrated Inductors for RF Applications", pp. 19-21, Spinger 2003.*
Zhang, F. and Kingset, P.R., IEEE Journal of Solid State Circuits, vol. 41, No. 10, Oct. 2006 pp. 2265-2271, Introduction.*

* cited by examiner

Primary Examiner — Steven J Mottola
Assistant Examiner — Hafizur Rahman
(74) Attorney, Agent, or Firm — Sawyer Law Group, P.C.

(57) ABSTRACT

An integrated circuit is disclosed. The integrated circuit includes an amplifier and a capacitor array coupled to the amplifier. The capacitor array is configured to be coupled in parallel to an inductor that is external to the integrated circuit, and the capacitor array and the external inductor comprise a tank circuit. The integrated circuit includes a resistor array coupled in parallel with the capacitor array. The resistor array is utilized to provide an overall frequency response of the capacitor array and resistor array that is opposite of a frequency response of the external inductor over a predetermined frequency range.

12 Claims, 9 Drawing Sheets

CIRCUIT FOR PROVIDING A FLAT GAIN RESPONSE OVER A SELECTED FREQUENCY RANGE AND METHOD OF USE

CROSS-REFERENCE TO RELATED APPLICATION

This application claims benefit under 35 USC 119(e) of U.S. Provisional Patent Application No. 61/776,041, filed on Mar. 11, 2013, which is incorporated herein by reference in its entirety.

FIELD OF THE INVENTION

The present invention relates generally to integrated circuits and more particularly to improve the performance of an amplifier.

BACKGROUND

A Frequency Modulated (FM) Transmitter typically utilizes an LC tank circuit coupled as a load. Due to the FM frequency range of 65 MHz~108 MHz, it is not possible to implement both capacitor and inductor onto silicon die simultaneously. For practical silicon die area, only the capacitor is realized on-chip and made tunable for channels selection. An external inductor (L) is utilized (for example, L=120 nH) to form the required LC tank circuit. A flat gain response is desirable.

A FM transmitter maintaining a flat gain for a frequency range of interest is essential for several reasons. Some of those reasons are enumerated below:
- For every dB increment in FM transmitter power, the $N^{th}$ harmonic of the FM transmitter increases by N dB.
- With a wide FM operating frequency range such as 65 MHz~108 MHz, the harmonics level at the FM transmitter output become important. For example, on the higher end of FM frequency, the $9^{th}$ harmonics fall inside a GSM band.
- For the FM transmitter, the desired signal at 120 dBµV is to be delivered over the full frequency range of 65 MHz~108 MHz. The corresponding harmonics that fall inside the cellular band must be at most −120 dBm (conducted) to avoid interfering with the cellular system.
- If the gain of the FM transmitter is not flat, then to meet the desired signal level of 120 dBµV at 65 MHz will also result in higher output level at 108 MHz. And the corresponding cellular in-band harmonics will be compromised.

However, if the FM transmitter gain is flat over the frequency range of interest the above identified issues can be minimized.

However, there are limitations in providing a FM transmitter with a flat gain over a wide frequency range when utilizing an external inductor (L). Some of the limitations are described below:
- The Q of the external L varies across a wide operating frequency (for example, 65 MHz~108 MHz)
- The Q of the external L varies with manufacturers.
- The frequency response of the external L itself varies greatly over frequency.

With such external inductor characteristics, a flat gain response over 65 MHz<f<108 MHz is difficult to achieve without significantly affecting cost and potentially the size of the FM transmitter.

Accordingly, what is needed is a system and method that addresses the above-identified issue. The system and method should be adaptable, cost effective and easily implemented in existing transmitters. The present invention addresses such a need.

SUMMARY

An integrated circuit is disclosed. The integrated circuit comprises an amplifier and a capacitor array coupled to the amplifier. The capacitor array is configured to be coupled in parallel to an inductor that is external to the integrated circuit, wherein the capacitor array and the external inductor comprise a tank circuit. The integrated circuit includes a resistor array coupled in parallel with the capacitor array. The resistor array is utilized to provide an overall frequency response of the capacitor array and resistor array that is opposite of the frequency response of the external inductor over a predetermined frequency range.

A system and method in accordance with and embodiment can be applied to any amplifier that requires flat gain response at its output. The embodiment does not require any digital control loop (sophisticated or simple), feedback loop, envelope detector etc to achieve a relatively flat gain response.

In an embodiment, the gain response is auto adjusted with respect to the operating frequency without requiring any feedback circuit. Finally, a system and method in accordance with an embodiment does not require any sophisticated digital control signal to adjust the gain response.

DETAILED DESCRIPTION

The present invention relates generally to electrical circuits and more particularly to improve the performance of an amplifier. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Figure 1A:
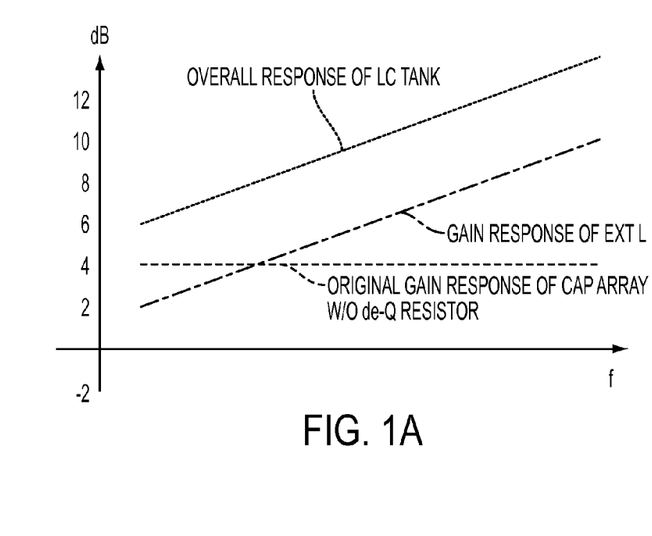
FIGS. 1A and 1B are diagrams that illustrate the overall response of an LC tank circuit before predistortion of a capacitor array of the LC tank circuit and the overall response of the LC tank circuit after predistortion of the capacitor array.
Figure 1B:
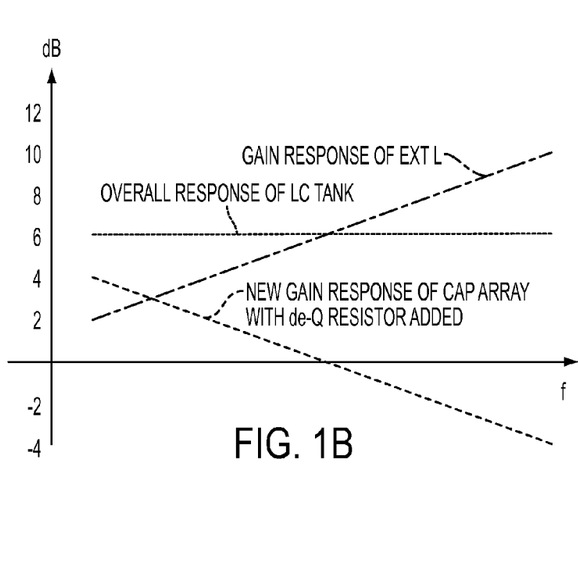

FIGS. 1A and 1B are diagrams that illustrate the overall response of an LC tank circuit before predistortion of a capacitor array of the LC tank circuit and the overall response of the LC tank circuit after predistortion of the capacitor array. To counter a gain imbalance of an amplifier over a range of frequencies of interest as a result of utilizing an external inductor, a technique to pre-distort the frequency response of a capacitor array utilized within the amplifier is disclosed. Instead of allowing a capacitor array associated with the LC circuit to have flat response as shown in FIG. 1A, the technique provides for a change in the frequency response of the capacitor array in a direction opposite of a frequency response of the external inductor as shown in FIG. 1B.

By proportionally changing the on-chip capacitor array response in the opposite direction to the external inductor over the FM frequency by a resistor array, a flat response is provided. At low frequency, the resistor array introduces a larger parallel resistor (Rp) across the LC tank circuit. Therefore, the circuit Q is higher, resulting in smaller gain loss. At high frequency, the resistor array introduces a smaller parallel resistor (Rp) across the LC tank circuit and the circuit Q is lower, resulting in larger gain loss. Together with the external inductor L, the net result is a flat response of the amplitude of the amplifier.

To describe the features of the present invention in more detail refer now to the following description in conjunction with the accompanying figures.

Figure 2:
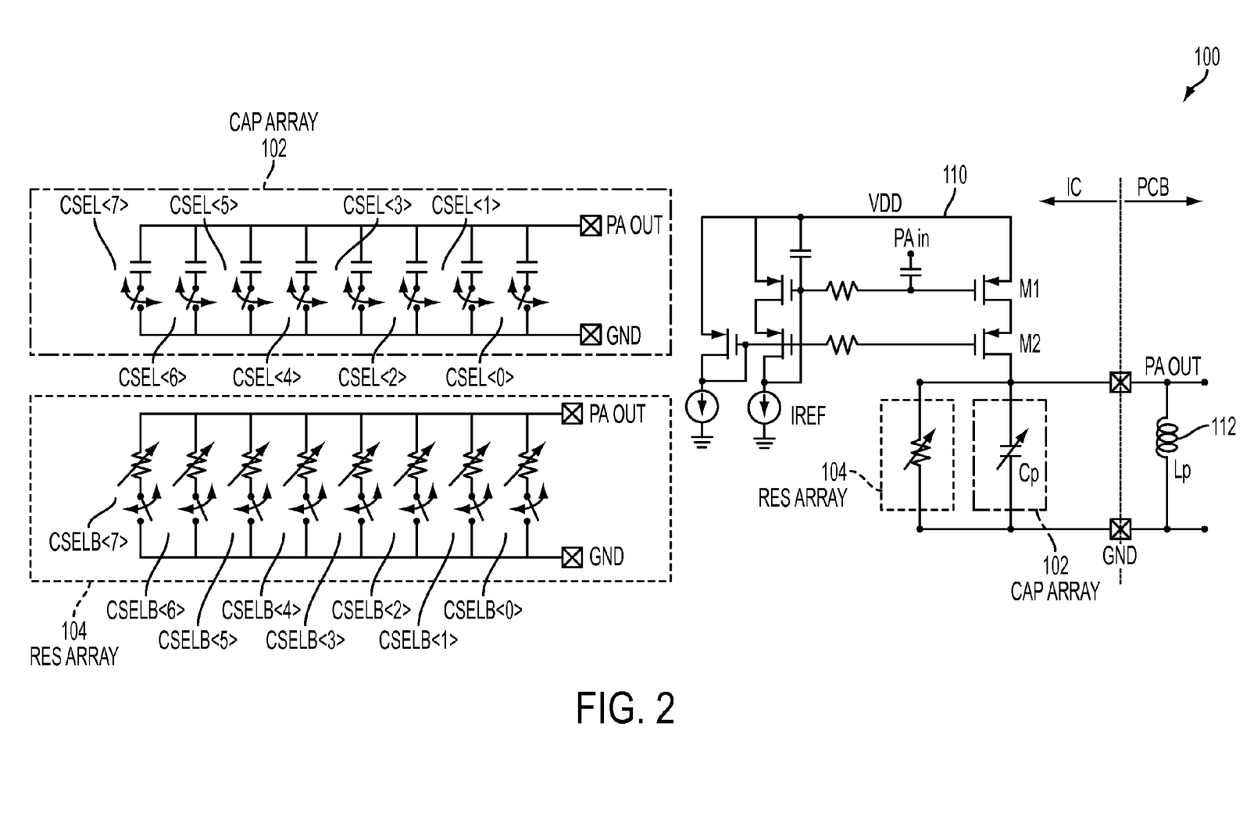
FIG. 2 is a first embodiment of an amplifier circuit in accordance with the present invention.

FIG. 2 is a first embodiment of an amplifier circuit 100 in accordance with the present invention. The amplifier circuit comprises the amplifier 110 coupled to a tank circuit comprising capacitor array 102 and an external inductor (L) 112. The inductor (L) 112 is an off-chip component. The capacitor array 102 is on-chip and in an embodiment is binary-weighted as it progresses from last significant bit (LSB) to most significant bit (MSB) of the capacitor array 102. In an embodiment, the Q of the LC tank circuit comprising capacitor array 102 and an external inductor (L) 112 is maintained by adding a resistor array 104 in parallel to the capacitor array 102. The frequency response of the capacitor array 102 may therefore be pre-distorted in an opposite direction of the external inductor (L) 112 utilizing the resistor array 104, thus, cancelling the effect of the frequency response of the external inductor 112.

Accordingly, the resistor array 104 is utilized to beneficially affect the Q of LC tank (102, 112). If all of the resistors of the resistor array 104 are connected to ground, the Q of LC tank (102, 112) will be lower. If all of the resistors of the resistor array 104 are disconnected, then the Q will be higher.

The resonance frequency of the tank circuit is given by the equation $f_s=1/(2\pi\sqrt{L_pC_p})$. Hence, in this implementation, for a higher frequency operation, a lesser number of branches of capacitors are required from capacitor array 102. However, at this frequency, more resistor branches of the resistor array are connected in parallel to the LC tank (102, 112), which has the effect of a smaller parallel resistance (Rp); hence, there is a lower Q at a higher frequency operation.

To operate at lower frequency, more branches of capacitors of the capacitor array 102 are used. At the same time, a lesser number of branches of resistors in the resistor array 104 are connected in parallel to the LC tank (102, 112). This results in a larger Rp; hence, there is a higher Q at lower frequency operation.

At the resonance frequency, the peak amplitude of amplifier 100 is determined by the Q of the LC tank (102,112). The Q is given by the equation $Q=R_p/\omega L_p=\omega R_p C_p$. Hence, if the Q of the tank (102,112) circuit is maintained throughout the FM frequency, the amplitude of the amplifier will also be maintained.

Figure 3:
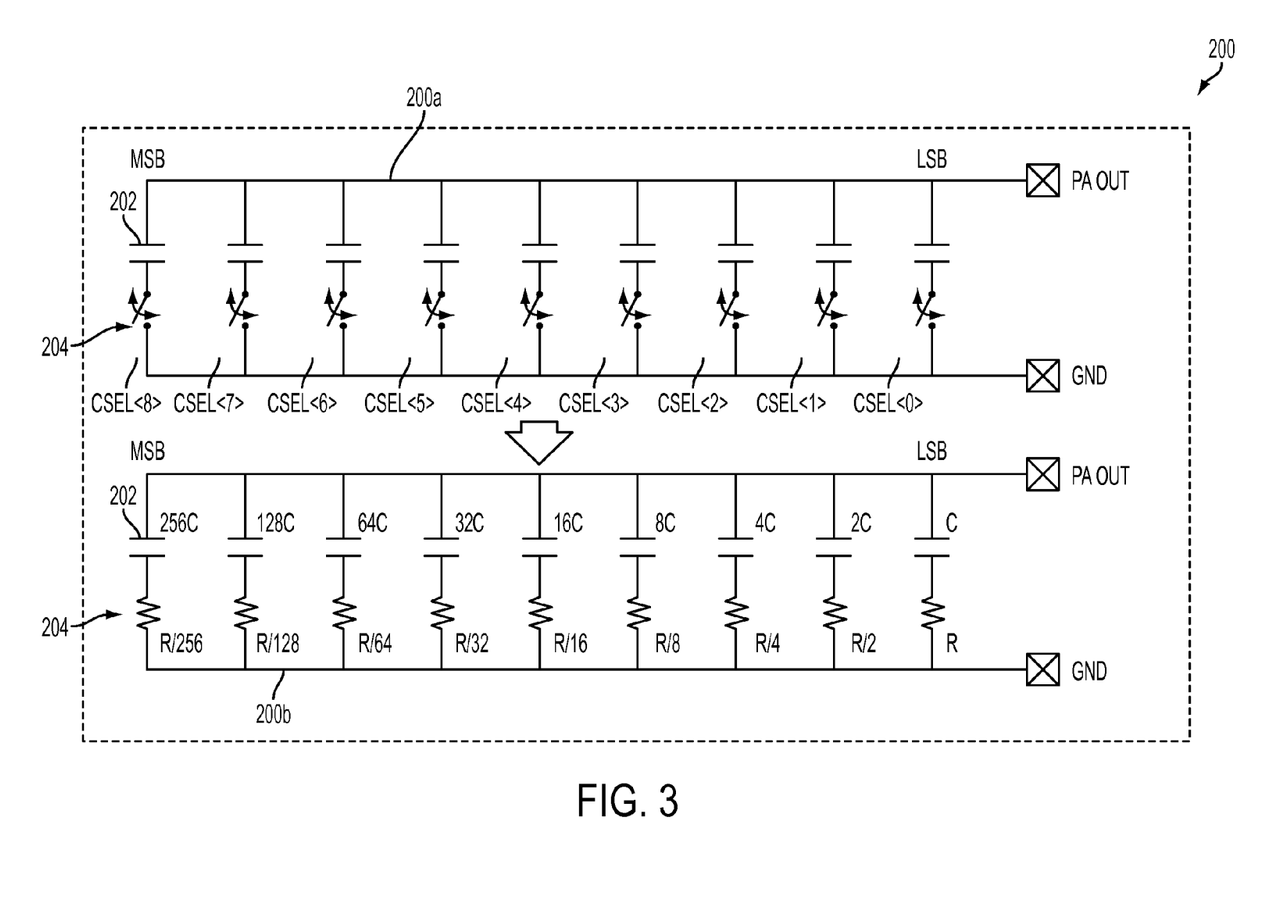
FIGS. 3 and 4A-4C illustrate the operation of the capacitor array in accordance with an embodiment.

FIGS. 3 and 4A-4C illustrate the operation of the capacitor array 202 in accordance with an embodiment. Referring to FIG. 3, as is seen array 200a and array 200b are identical except array 200a represents the MOS switch for the selection of the individual capacitor branch by control bits CSEL<8:0> as switches 204 and in array 200b these MOS switches are represented as resistors 204 when they are ON. To resonate at a lowest frequency, a maximum number of capacitors in capacitor array 202 are used, i.e. ALL CSEL<8:0> are ON. The resonance frequency at $f_s=1/(2\pi\sqrt{L_pC_{max}})$ is the lowest.

To resonate at highest frequency, a minimum number of capacitors of the in the capacitor array 202 are utilized; i.e. ONLY CSEL<0> is ON. The resonance frequency at $f_s=1/(2\pi\sqrt{L_pC_{min}})$ is the highest.

Each branch of the capacitor array 202 has its corresponding Q given by $Q=X_c/R$, where R is the ON resistance of a switch in each branch. A capacitor of the capacitor array 202 and a resistor of the resistor array 204 are doubled and halved respectively with respect to the previous branch of capacitor as LSB→MSB is traversed (shown in FIG. 3, and FIGS. 4A-4C, 302, 304 and 306 respectively).

In so doing:
1) Every branch of capacitor array 202 in FIG. 3 has the same Q value $$Q_S = \frac{X_{CS}}{R_S} = \frac{1}{\omega R_S C_S}$$

Also, $R_P = (Q_S^2 + 1)R_S$, $C_P = \left(\frac{Q_S^2}{Q_S^2 + 1}\right)C_S$ $$Q_P = \frac{R_P}{X_P} = \omega R_P C_P = \omega(Q_S^2 + 1)R_S * \left(\frac{Q_S^2}{Q_S^2 + 1}\right)C_S = Q_S^2 \omega R_S C_S = Q_S$$

(i) For $R_S = R$, $C_S = C$, then $Q_S = \frac{1}{\omega RC}$ $R_{P1} = (Q_S^2 + 1)R$; $C_{P1} = \left(\frac{Q_S^2}{Q_S^2 + 1}\right)c$ (ii) For $R_S = \frac{R}{2}$, $C_S = 2C$, then $Q_S = \frac{1}{\omega RC}$ $R_{P2} = (Q_S^2 + 1)\frac{R}{2}$; $C_{P2} = \left(\frac{Q_S^2}{Q_S^2 + 1}\right)2C$ (iii) For $R_S = \frac{R}{16}$, $C_S = 16C$, then $Q_S = \frac{1}{\omega RC}$ $R_{P16} = (Q_S^2 + 1)\frac{R}{16}$; $C_{P16} = \left(\frac{Q_S^2}{Q_S^2 + 1}\right)16C$ Every branch of capacitor array 202 has the same $Q_s$.

Figure 4A:
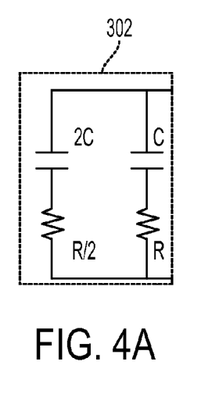
Figure 4B:
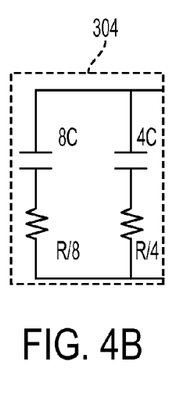
Figure 4C:
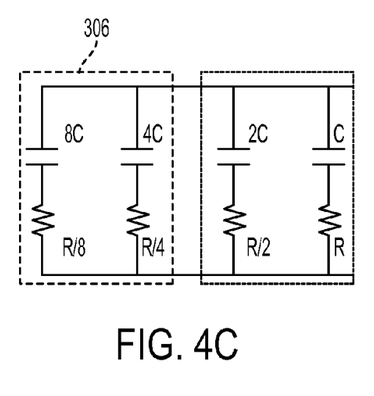

2) Any combination of the branch of capacitors in the capacitor array 202 in parallel will yield the same Q value. As an example (FIGS. 4A-4C, 302, 304, 306), the derivation for 2 branches in parallel is given:

For following 2 branches $R_{P1}$ and $R_{P2}$ in parallel $R_P = $ $$\frac{R_{P1} * R_{P2}}{R_{P1} + R_{P2}} = \frac{(Q_S^2 + 1)R * (Q_S^2 + 1)\frac{R}{2}}{(Q_S^2 + 1)R + (Q_S^2 + 1)\frac{R}{2}} = \frac{(Q_S^2 + 1)^2 R * \frac{R}{2}}{(Q_S^2 + 1)\frac{3R}{2}} = (Q_S^2 + 1)\frac{R}{3}$$

$$C_P = C_{P1} + C_{P2} = \left(\frac{Q_S^2}{Q_S^2 + 1}\right)3C$$

-continued $$Q_P = \frac{R_P}{1/\omega C_P} = \omega R_P C_P = \omega(Q_S^2+1)\frac{R}{3}*\left(\frac{Q_S^2}{Q_S^2+1}\right)3C = Q_S^2\omega RC = Q_S = \frac{1}{\omega RC}$$

With the Q value maintained, the capacitor array 202 will have a flat gain response over the operating frequency range of interest. Accordingly, due to its implementation approach, each branch of the capacitor array 202 or any combination of the capacitor branches has same Q. Consequently, the capacitor array 200 itself will result in a flat gain response.

Figure 5A:
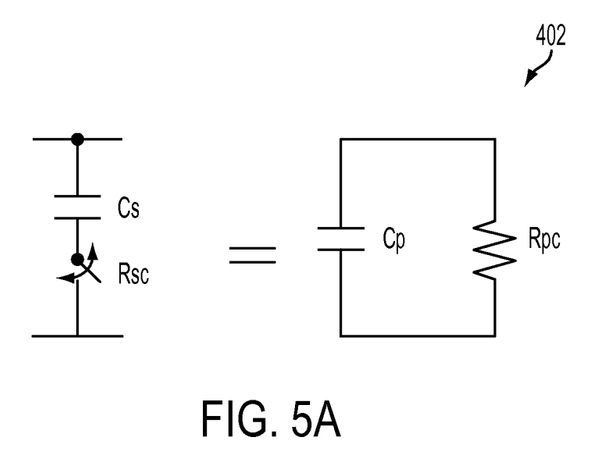
FIG. 5A illustrates the series and parallel equivalent circuits of the capacitor array of the LC tank circuit in accordance with an embodiment.

FIG. 5A illustrates the series and parallel equivalent circuits 402 of the capacitor array of the LC tank circuit in accordance with an embodiment. At resonance, each capacitor in the capacitor array can be represented by its parallel equivalent circuits which are represented by the equations below.

| In Series | In Parallel |
|---|---|
| $Q_s = X_{cs}/R_{sc} = 1/\omega R_{sc}C_s$ | $R_{pc} = (Q_s^2+1)R_{sc}$ <br> $C_p = [Q_s^2/(Q_s^2+1)]C_s$ <br> $Q_p = R_{pc}/X_{cp}$ |

Figure 5B:
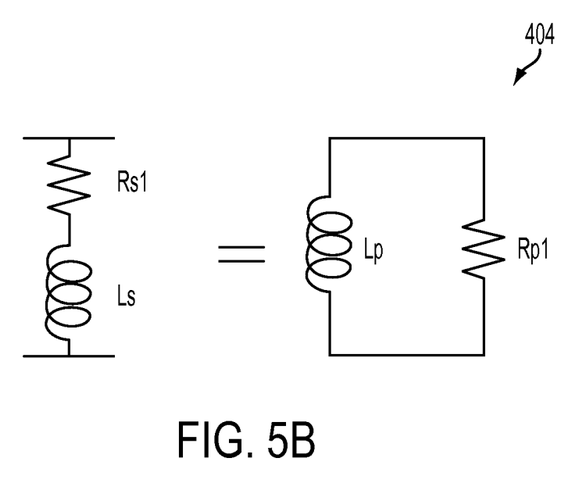
FIG. 5B illustrates the series and parallel equivalent circuits of the external inductor of the LC tank circuit in accordance with an embodiment.

FIG. 5B illustrates the series and parallel equivalent circuits 404 of the external inductor of the LC tank circuit in accordance with an embodiment. At resonance, the external inductor can be represented by its parallel equivalent circuits which are represented by the equations below.

| In Series | In Parallel |
|---|---|
| $Q_s = X_{Ls}/R_{sl}$ <br> $R_{sl} = X_{Ls}/Q_s = \omega L_s/Q_s$ | $R_{pl} = (Q_s^2+1)R_{sl}$ <br> $L_p = [(Q_s^2+1)/Q_s^2]L_s$ <br> $Q_p = R_{pl}/X_{Lp}$ |

Figure 6:
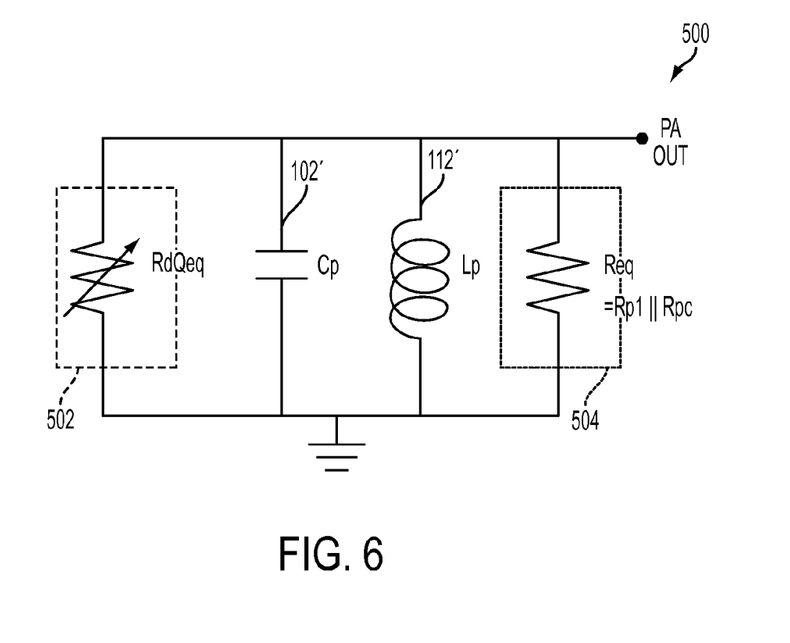
FIG. 6 is a diagram of the LC equivalent tank circuit in accordance with an embodiment.

FIG. 6 is a diagram of the LC equivalent tank circuit 500 in accordance with an embodiment. The equivalent LC tank 500 is given by a parallel network of RLC. The resonance frequency for circuit 500 is given by the equation, $$\omega_o = 1/(\sqrt{L_p C_p}).$$

$$Q_p = (R_{dQeq}\|R_{eq})/X_{Lp}$$
$$= (R_{dQeq}\|R_{eq})/\omega_o L_p$$
$$= (R_{dQeq}\|R_{eq})/\sqrt{(L_p/C_p)}$$

At resonance, the reactance cancels out, leaving only the $(R_{dQeq}\|R_{eq})$ as the load. The value of $(R_{dQeq}\|R_{eq})$ is determined by two resistive components:

Parallel resistance of the resistor array $R_{dQeq}$ 502

Series resistance of external L 504, which dominated the value of the equivalent parallel $R_{eq}$ from capacitor array and external inductor Both of these resistances affects Q value of the LC tank circuit 500.

The amplifier gain is given by $g_m(R_{dQeq}\|R_{eq})$, therefore to achieve a flat gain over the frequency of operation, it is essential for $(R_{dQeq}\|R_{eq})$ to remain fairly constant.

Figure 7:
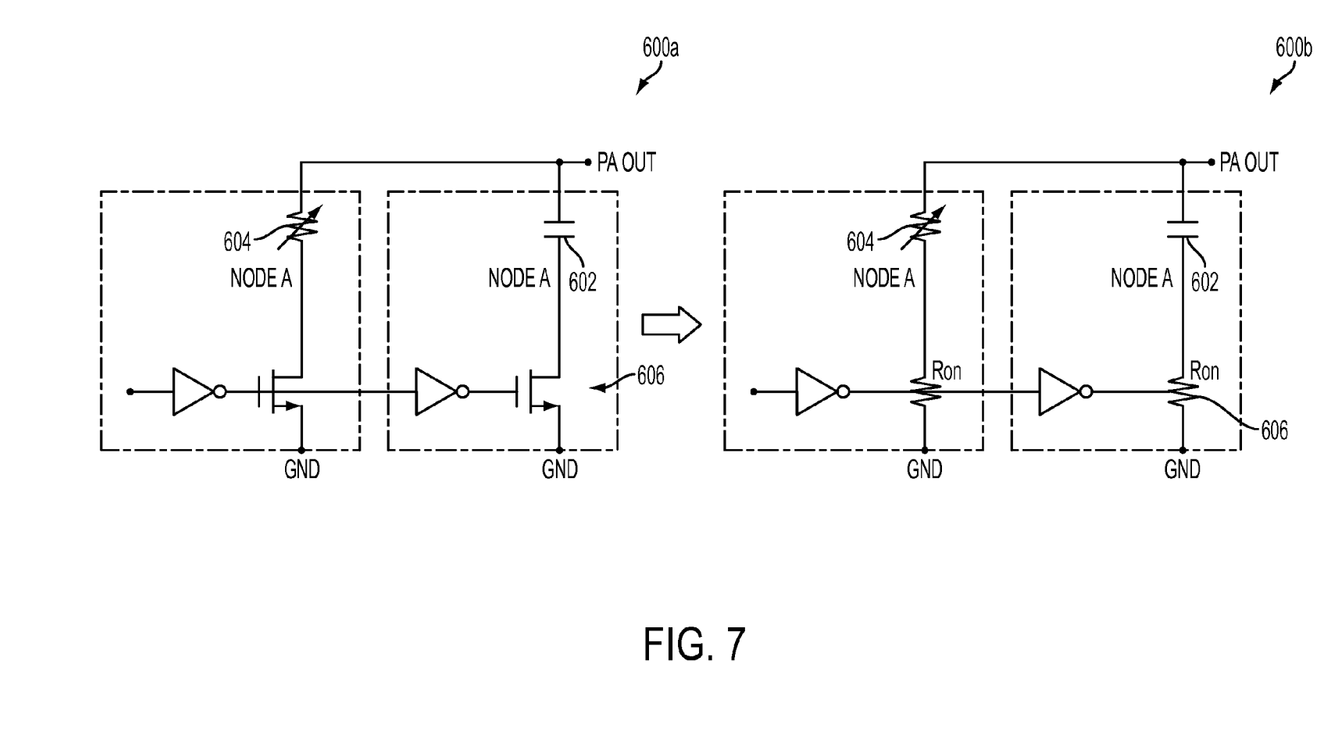
FIG. 7 is a first embodiment of an implementation the resistor capacitor array.

FIG. 7 is a first embodiment of an implementation the resistor/capacitor array 600. This implementation ensures that when a capacitor branch 602 is selected, its corresponding shunt resistor 604 is not selected.

For the lowest frequency operation, all capacitors 602 are connected, all resistors 604 are disconnected, the effective parallel R is highest, and the de-Qing effect on the LC tank network by the resistor array is the lowest and there is lower attenuation at the lowest frequency. In contrast for the highest frequency operation, all capacitors 602 are disconnected, all resistors 604 are connected, the effective parallel resistance is the lowest, and the de-Qing effect is the largest on the LC tank network by the resistor array and there is higher attenuation at the highest frequency.

The equivalent resistance (R) (contributed by each branch of the resistor and capacitor array) determines the amount of attenuation. Hence, if the equivalent R of each branch is further fine tuned, the desired gain flatness can be achieved.

Figure 8:
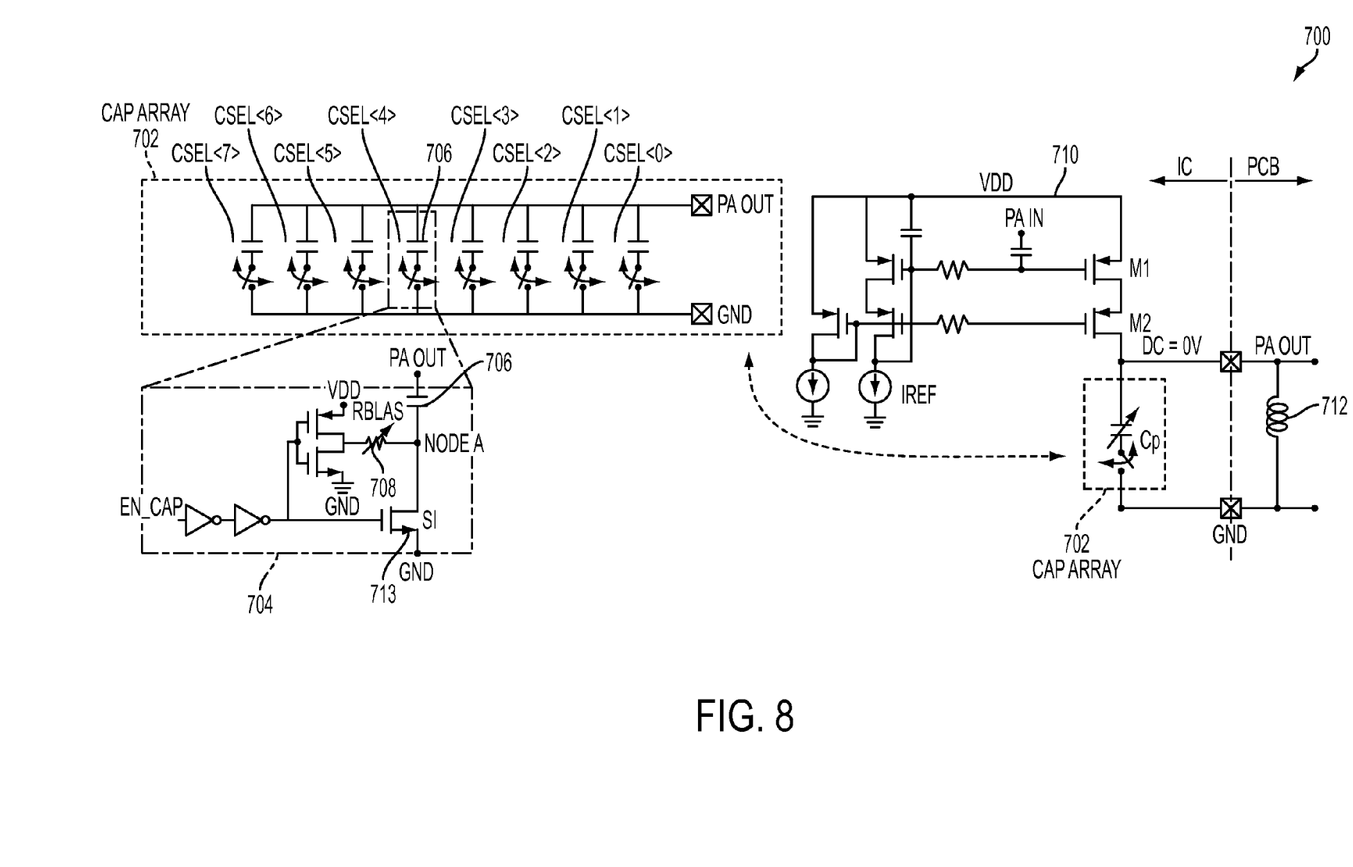
FIG. 8 a second embodiment of an implementation the resistor capacitor array.

FIG. 8 a second embodiment of an implementation a capacitor array 702 in an amplifier circuit 700. Here, the resistor array for degrading the quality value (de-Qing) the LC tank (702, 712) is embedded inside the capacitor array 702 as a bias resistor (RBIAS) 708.

When the EN_CAP signal=0,

The switch 713=OFF. Hence, the capacitor 706 is not shunted to GND by switch 713.

RBIAS 708 is pulled to VDD (AC GND). Hence, the capacitor 706 is connected to AC GND via RBIAS 708. However, RBIAS is large (~10 s kΩ). Hence, the capacitor sees a high impedance to AC ground which renders that particular capacitor ineffective in the LC tank (702,712). Hence, for the unselected capacitor 706 inside the capacitor array 702, a series $(R_{S1(OFF)}\|R_{BIAS})C$ network is formed. The equivalent parallel resistance contributed by this unselected capacitor 706 is $R_{pc}=(Q_s^2+1)(R_{S1(OFF)}\|R_{BIAS})$ and its value is large since both $R_{S1(OFF)}$ and RBIAS are large.

When the EN_CAP signal=1, the capacitor 706 is used to form the LC tank resonance frequency. At the same time, RBIAS708 is parallel to an ON resistance of switch 713. These parallel resistances form the series equivalent R for each of the capacitor branches when EN_CAP=1. Since the ON resistance of switch 713 is small (few Ω⁻100 s Ω), it dominates the value of the series equivalent R presenting a low impedance to GND for the capacitor 706 of the capacitor array 702. Effectively, this makes the capacitor 706 of the capacitor array 702 part of the LC tank (702,712).

The reason for pulling RBIAS 708 to VDD (>1.4V) during EN_CAP=0 is to prevent the negative swing of node A from turning on the diode of the PN junction of switch 713. By ensuring this PN junction is OFF, distortion in the signal is mitigated. Hence, the harmonic distortion of the power amplifier due to the PN junction is prevented.

Hence, for higher frequency operation, a smaller number of capacitors 706 are required from capacitor array 702 and more RBIAS 708 branches are connected, resulting in a smaller equivalent parallel resistance $R_{pc}$ to the LC tank (702, 712). Hence, lower Q at higher frequency operation.

Similarly, for lower frequency operation, a larger number of branches of capacitors 706 are required from capacitor array 706 and less RBIAS 708 branches are connected, resulting in a larger equivalent parallel resistance $R_{pc}$ to the LC tank. Hence, higher Q at lower frequency operation.

The RBIAS 708 of each branch can be fine tuned further to achieve the desired de-Qing effect, hence, the flatness of the gain response. Besides de-Qing, RBIAS 708 also ensures the switch 713 stays OFF when the capacitor 706 of the capacitor array 702 is not selected (EN_CAP=0). The switch 713 is ensured OFF by biasing node A to a specific biasing voltage to prevent PN junction from turning ON as a result of the voltage swing.

Advantages

A circuit in accordance with an embodiment provides for area saving as a result of no requirement for feedback circuit. Furthermore the circuit has lower power consumption than conventional circuits a result of needing a smaller number of additional circuits (e.g. digital circuit, feedback loop, envelope detector etc). The circuit provides for a flat gain over a wide range of operating frequencies.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the present invention.

What is claimed is:

1. An integrated circuit comprising:
   an amplifier;
   a capacitor array coupled in parallel to the amplifier, wherein the capacitor array is configured to be coupled in parallel to an inductor that is external to the integrated circuit, wherein the capacitor array and the external inductor comprise a tank circuit; and
   a resistor array embedded within the capacitor array, wherein each resistor within the resistor array comprises a bias resistance, wherein the resistor array is utilized to provide an overall frequency response of the capacitor array and the resistor array that is substantially opposite to a frequency response of the external inductor over a predetermined frequency range.

2. The integrated circuit of claim 1, wherein the resistor array ensures that a loss in overall Q of the tank circuit at a higher frequency is larger than at a lower frequency.

3. The integrated circuit of claim 1, wherein the resistor array pre-distorts a frequency response of the capacitor array in an opposite direction of the frequency response of the external inductor.

4. The integrated circuit of claim 3, wherein as the frequency increases, the capacitor array introduces a decreasing resistance across the external inductor by means of increasing the number of resistor branches across the external inductor.

5. The integrated circuit of claim 1, wherein for a higher frequency operation, less capacitance from the capacitor array and more resistance from the resistor array are connected in parallel to the tank circuit, wherein for a lower frequency operation, more capacitance from the capacitor array and less resistance from the resistor array are connected in parallel to the external inductor.

6. The integrated circuit of claim 1, wherein for the lowest frequency resonance all of the capacitors in the capacitor array are connected and none of the resistors in the resistor array are connected and for the highest frequency resonance all of the resistors in the resistor array are connected and none of the capacitors in the capacitor array are connected.

7. The integrated circuit of claim 1, wherein when a bias resistance is selected to be in series with its associated capacitor, the associated capacitor is not part of the tank circuit, and wherein when the bias resistance is not selected to be in series with its associated capacitor, the associated capacitor is part of the tank circuit.

8. The integrated circuit of claim 2, wherein when the resistor array ensures a loss in overall Q of the tank circuit at a higher frequency is larger than at lower frequency, a flat frequency response over the predetermined frequency range is provided.

9. The integrated circuit of claim 1, wherein the resistor array pre-distorts a frequency response of the capacitor array by proportionally degrading a quality value of (de-Qing) the capacitor array over the frequency range of interest, wherein as the frequency increases, the capacitor array will introduce a larger resistance across the tank circuit.

10. The integrated circuit of claim 1, wherein end of the bias resistance are controlled by a switch that intrinsically includes a PN junction.

11. The integrated circuit of claim 10, wherein the bias resistance during a negative signal swing at a node defined by a connection of the capacitor and the bias resistance ensures that the switch is off by coupling the node to a higher biasing voltage when the capacitor is not selected for a particular operating frequency.

12. The integrated circuit of claim 10, wherein the bias resistance mitigates harmonics distortion of the amplifier by avoiding nonlinear characteristics of the switch when the switch is in an inactive state.

* * * * *